United States Patent
Ramos et al.

(10) Patent No.: US 10,793,730 B2
(45) Date of Patent: Oct. 6, 2020

(54) SHORT-CHAIN FLUOROSURFACTANTS WITH IODIDE ADDITIVES FOR FORMING SILVER NANOWIRE-BASED TRANSPARENT CONDUCTIVE FILMS

(71) Applicant: Cambrios Film Solutions Corporation, Tortola (VG)

(72) Inventors: Teresa Ramos, San Jose, CA (US); Lin Zhang, Burlingame, CA (US); Lily Pay, San Jose, CA (US)

(73) Assignee: Cambrios Film Solutions Corporation, Tortola (VG)

(*) Notice: Subject to any disclaimer, the term of this patent is extended or adjusted under 35 U.S.C. 154(b) by 0 days.

(21) Appl. No.: 16/583,672

(22) Filed: Sep. 26, 2019

(65) Prior Publication Data
US 2020/0017695 A1 Jan. 16, 2020

Related U.S. Application Data

(63) Continuation of application No. 16/030,846, filed on Jul. 9, 2018, now Pat. No. 10,465,081, which is a
(Continued)

(51) Int. Cl.
| | |
|---|---|
| C09D 11/03 | (2014.01) |
| C09D 5/24 | (2006.01) |
| C09D 11/52 | (2014.01) |
| H01B 1/22 | (2006.01) |
| H05K 1/09 | (2006.01) |
| C09D 7/40 | (2018.01) |
| H01L 31/18 | (2006.01) |

(Continued)

(52) U.S. Cl.
CPC .............. *C09D 11/03* (2013.01); *B01F 17/00* (2013.01); *C09D 5/00* (2013.01); *C09D 5/24* (2013.01); *C09D 7/43* (2018.01); *C09D 7/45* (2018.01); *C09D 7/61* (2018.01); *C09D 7/70* (2018.01); *C09D 11/033* (2013.01); *C09D 11/52* (2013.01); *H01B 1/22* (2013.01); *H01L 31/022466* (2013.01); *H01L 31/1884* (2013.01)

(58) Field of Classification Search
None
See application file for complete search history.

(56) References Cited

U.S. PATENT DOCUMENTS

| | | | |
|---|---|---|---|
| 8,632,700 B2* | 1/2014 | Winoto | B82Y 10/00 252/514 |
| 9,586,816 B2* | 3/2017 | Bhatia | B82Y 20/00 |

(Continued)

FOREIGN PATENT DOCUMENTS

| | | |
|---|---|---|
| WO | WO 2009/108304 A1 * | 9/2009 |
| WO | WO 2010/129604 A1 * | 11/2010 |

OTHER PUBLICATIONS

Search Report of the International Search Authority dated Jan. 27, 2016 for PCT/US2015/059240; 2 pages.*
(Continued)

*Primary Examiner* — Helene Klemanski
(74) *Attorney, Agent, or Firm* — Cooper Legal Group, LLC

(57) ABSTRACT

Disclosed herein are purified surfactant formulations including purified short-chain fluorosurfactant and iodide additive and a two-part coating kit having the same and a silver nanowire formulation.

20 Claims, 1 Drawing Sheet

Related U.S. Application Data continuation of application No. 15/523,113, filed as application No. PCT/US2015/059240 on Nov. 5, 2015, now Pat. No. 10,040,956.

(60) Provisional application No. 62/075,733, filed on Nov. 5, 2014.

(51) Int. Cl.
| | |
|---|---|
| *C09D 11/033* | (2014.01) |
| *H01L 31/0224* | (2006.01) |
| *C09D 5/00* | (2006.01) |
| *B01F 17/00* | (2006.01) |
| *C09D 7/43* | (2018.01) |
| *C09D 7/45* | (2018.01) |
| *C09D 7/61* | (2018.01) |

(56) References Cited

U.S. PATENT DOCUMENTS

| | | | | |
|---|---|---|---|---|
| 10,040,956 B2* | 8/2018 | Ramos | | C09D 5/24 |
| 10,465,081 B2* | 11/2019 | Ramos | | C09D 7/45 |
| 2006/0149012 A1* | 7/2006 | Terrazas | | C08F 220/28 |
| | | | | 526/288 |
| 2008/0143906 A1* | 6/2008 | Allemand | | B82Y 10/00 |
| | | | | 349/43 |
| 2010/0307792 A1* | 12/2010 | Allemand | | B82Y 10/00 |
| | | | | 174/126.1 |
| 2011/0024159 A1* | 2/2011 | Allemand | | B82Y 10/00 |
| | | | | 174/126.1 |
| 2012/0116017 A1* | 5/2012 | Brothers | | C08F 14/18 |
| | | | | 524/805 |
| 2012/0223358 A1* | 9/2012 | Pschenitzka | | B82Y 30/00 |
| | | | | 257/99 |
| 2014/0054515 A1* | 2/2014 | Lowenthal | | H01B 1/22 |
| | | | | 252/513 |
| 2014/0202742 A1* | 7/2014 | Jones | | B23K 26/18 |
| | | | | 174/253 |
| 2015/0290715 A1* | 10/2015 | Moody | | H01B 1/22 |
| | | | | 420/501 |
| 2017/0169911 A1* | 6/2017 | Hu | | C22B 11/04 |
| 2017/0198155 A1* | 7/2017 | Lovenich | | H01B 1/22 |
| 2017/0342280 A1* | 11/2017 | Ramos | | H01B 1/22 |
| 2018/0312703 A1* | 11/2018 | Ramos | | C09D 5/24 |

OTHER PUBLICATIONS

Written Opinion of the International Search Authority dated Jan. 27, 2016 for PCT/US2015/059240; 4 pages.*

* cited by examiner

SHORT-CHAIN FLUOROSURFACTANTS WITH IODIDE ADDITIVES FOR FORMING SILVER NANOWIRE-BASED TRANSPARENT CONDUCTIVE FILMS

CROSS-REFERENCES TO RELATED APPLICATIONS

This application is a continuation of U.S. Non-Provisional patent application Ser. No. 16/030,846, filed Jul. 9, 2018, and now issued as U.S. Pat. No. 10,465,081, which is a continuation of U.S. Non-Provisional patent application Ser. No. 15/523,113, filed Apr. 28, 2017 and now issued as U.S. Pat. No. 10,040,956, which is a national stage entry of International Patent Application Ser. No. PCT/US2015/059240, filed Nov. 5, 2015, which claims the benefit of U.S. Provisional Patent Application Ser. No. 62/075,733, filed Nov. 5, 2014. U.S. Non-Provisional patent application Ser. No. 16/030,846, U.S. Non-Provisional patent application Ser. No. 15/523,113, International Patent Application Ser. No. PCT/US2015/059240, and U.S. Provisional Patent Application Ser. No. 62/075,733 are incorporated herein by reference in their entireties.

BACKGROUND

Technical Field

The disclosure relates to manufacturing light-stable transparent conductive films using a fluorosurfactant.

Description of the Related Art

Transparent conductive films are essential components in flat panel display devices such as a touch screen or a liquid crystal display (LCD). Using a solution-based format, it is possible to produce robust transparent conductive films on large area, flexible substrates.

Coating compositions or ink comprising conductive nanostructures (e.g., silver nanowires) can be coated on a wide range of rigid and flexible substrates to provide transparent conductive thin films or coatings. When suitably patterned, nanowire-based transparent conductors are used as transparent electrodes or thin film transistors in flat panel electrochromic displays such as liquid crystal displays (LCD), plasma displays, touch panels, electroluminescent devices such as organic light emitting diode (OLED), thin film photovoltaic cells (PV), and the like. Other applications of the nanowire-based transparent conductors include anti-static layers and electromagnetic wave shielding layers. Conventional printing processes such as continuous roll-to-roll printing can be adopted in coating conductive nanostructures to further reduce manufacturing cost and improve throughput.

Co-pending and co-owned U.S. Pat. Nos. 8,048,333, 8,709,125, 8,760,606, 8,632,700 and 8,815,126, as well as U.S. Published Patent Application Nos. 2010/0307792 and 2013/0001478 describe various approaches for synthesizing conductive nanowires (e.g., silver nanowires), preparing conductive films via a number of coating or printing methods. These documents are incorporated herein by reference in their entireties.

Depending on the coating methods, nanowire ink compositions are often formulated to address specific requirements such as ink stability, wettability and film defect control.

BRIEF SUMMARY

Provided here are aqueous coating compositions (ink) comprising conductive nanostructures (including silver nanowires) and short-chain fluorosurfactant.

One embodiment provides a purified surfactant formulation comprising
(1) a short-chain fluorosurfactant represented by Formula (I):

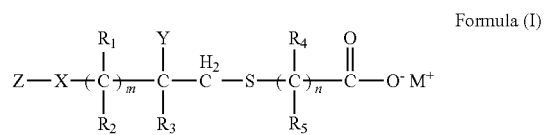

Formula (I)

(2) an impurity represented by Formula (II) at an amount of less than about 3% by weight of the short-chain fluorosurfactant,

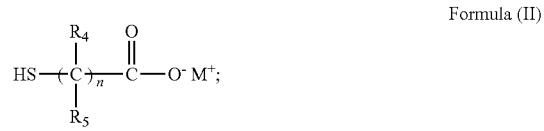

Formula (II)

and
(3) an iodide additive providing iodide at an amount of about 0.5-2.5% of the short-chain fluorosurfactant,
wherein,
m is 0, 1, 2, 3, 4 or 5;
n is 1, 2, 3, or 4;
X is —O—; —S—; or a direct bond;
Y is hydrogen, —OH or fluoro;
Z is —CH$_3$, —CH$_2$F, —CHF$_2$ or —CF$_3$;
M$^+$ is Li$^+$, Na$^+$, K$^+$, H$^+$ or NH$_4^+$; and
R$_1$, R$_2$, R$_3$, R$_4$ and R$_5$,
at each occurrence, are the same or different and independently fluoro or hydrogen.

A further embodiment provides a two-part kit for coating silver nanowires, comprising: (1) a first container including a nanowire formulation including: a plurality of silver nanowires; a viscosity modifier; an optional dispersant; and a liquid carrier including water; and (2) a second container including a purified surfactant formulation describe herein, wherein, the nanowire-containing formulation comprises silver ions at an amount of 0.005-0.02% per 1% of the silver nanowires by weight; and the purified surfactant formulation comprises iodide ions at an amount of about equimolar of the silver ions of nanowire-containing formulation.

DETAILED DESCRIPTION

Figure 1:
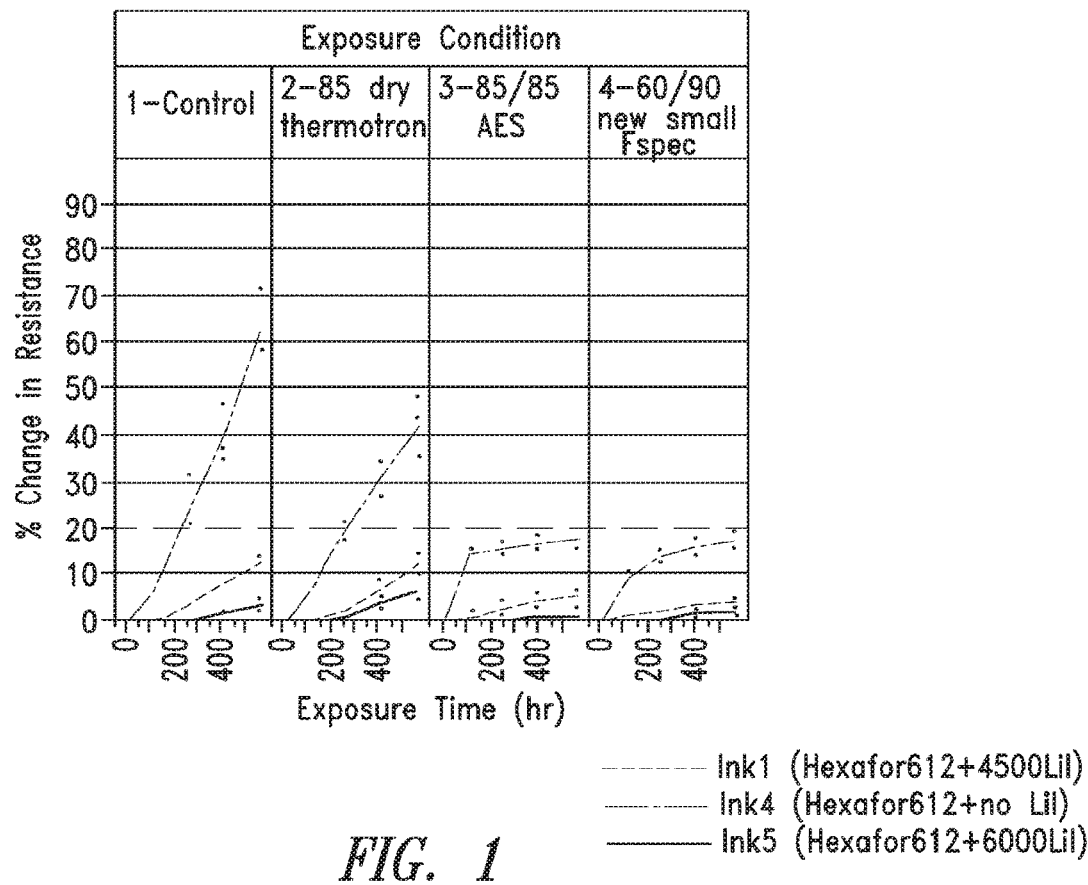
FIG. 1 shows the sheet resistance changes of conductive films over time under various reliability testing conditions.

Aqueous coating compositions for coating conductive nanostructures (including silver nanowires) are described herein. The coating composition (or "ink") further includes a fluorosurfactant, which facilitates dispersing, stabilizing and wetting of the coating composition.

Fluorosurfactants, also known as perfluorinated surfactants, are surfactants containing a plurality of fluoro substituents ("perfluo"), which typically have replaced the hydrogens of a hydrocarbon chain. Certain fluorosurfactants, including ZONYL® FSA (by DuPont), are known to be used in coating compositions of conductive nanostructures. See e.g., U.S. Pat. No. 8,632,700. However, the known fluorosurfactants generally have long carbon chains (i.e., at least 7 or 8 fluoro-bearing carbons). These long-chain fluorosurfactants have exceptionally long half-lives. Thus, there are considerable concerns over the bioaccumulation and environmental persistence of these materials.

This disclosure is thus directed to short-chain fluorosurfactants that have much lower environmental impact than the long-chain fluorosurfactants currently used in the art.

It has been discovered that better storage stability can be achieved when the silver nanowires and the fluorosurfactant are stored separately, only to be combined shortly before coating. Thus, the short-chain fluorosurfactant is formulated into a surfactant formulation, which is to be added to a nanowire-containing formulation to form a final coating composition that is ready to coat.

In addition, the short-chain fluorosurfactants are purified to minimize impurities that may passivate the conductive nanostructures. In particular, certain reactants for preparing the short-chain fluorosurfactants contain functional groups (e.g., —SH) that have affinity for the conductive nanostructures (e.g., silver nanowires), thus forming a passivating layer that impedes wire-wire contacts and reduces conductivity.

Moreover, the fluorosurfactant formulation further comprises an iodide additive in an amount effective for forming light-stable conductive films. While not being bound by any theories, it is believed that a trace amount of silver ions (Ag+), which is found to be proportional to the amount of silver nanowires in the nanowire formulation, may ultimately contribute to silver nanowire degradation in the conductive film due to ionic migration. The iodide additive is believed to effectively bound to silver ions to produce silver iodide (AgI), thus immobilizing the silver ions.

One embodiment is thus directed to a purified surfactant formulation comprising (1) a short-chain fluorosurfactant represented by Formula (I):

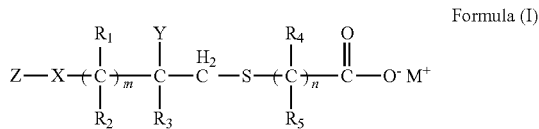

Formula (I)

(2) an impurity represented by Formula (II) at an amount of less than about 3% by weight of the short-chain fluorosurfactant:

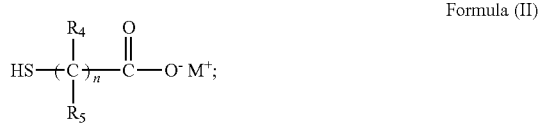

Formula (II)

and (3) an iodide additive providing iodide at an amount of about 0.5-2.5% of the short-chain fluorosurfactant, wherein, m is 0, 1, 2, 3, 4 or 5;
n is 1, 2, 3, or 4;
X is —O—; —S—; or a direct bond;
Y is hydrogen, —OH or fluoro;
Z is —CH$_3$, —CH$_2$F, —CHF$_2$ or —CF$_3$;
M$^+$ is Li$^+$, Na$^+$, K$^+$, H$^+$ or NH$_4^+$; and
R$_1$, R$_2$, R$_3$, R$_4$ and R$_5$,
at each occurrence, are the same or different and independently fluoro or hydrogen.

More specifically, in certain embodiments, there are no more than 6 fluoro-bearing carbons in the fluorosurfactant of Formula (I). "Fluoro-bearing carbon" means a carbon atom substituted with at least one fluoro.

In preferred embodiments, there are 4, 5 or 6 fluoro-bearing carbons.

In preferred embodiments, X is a direct bond.
In preferred embodiments, Y is —OH.
In preferred embodiments, Z is —CF$_3$.
In certain embodiments, m is 6 and n is 2.

In some embodiments, the impurity of Formula (II) is a thiol-containing alkonoic acid (e.g., R$_4$ and R$_5$ are hydrogen, M is H). The length of the alkonoic acid depends on n.

In preferred embodiments, the short-chain fluorosurfactant has 6 fluoro-bearing carbons and is commercially available under the trade name of Hexafor612N (Maflon, Bergamo Italy).

Hexafor612N from the commercial source generally has, depending on the lot, 8,000-20,000 ppm of a thiol-containing impurity in a solution of 25% surfactant.

In particular, the thiol-containing impurity is 3-mercaptopropionic acid. i.e., Formula (II) wherein n is 2, M is H, R$_4$ and R$_5$ are hydrogen.

To purify the fluorosurfactant, the impurity of Formula (II) may be removed by first converting the fluorosurfactant into an insoluble acid form (M is H), thereby separating the acid-form of the fluorosurfactant from the impurity. The acid-form is then converted back to a proper salt form (e.g., M$^+$ is Li$^+$). Details of the purification are further described in Example 1.

Thus, a purified fluorosurfactant formulation has an impurity of Formula (II) of less than about 3% by weight of the fluorosurfactant.

In preferred embodiments, the thiol-containing impurity is less than about 2%, or less than about 1.5%, or less than about 1%, or less than about 0.5%, or less than about 0.2% of the fluorosurfactant by weight.

In a preferred embodiment, the thiol-containing impurity is less than about 0.4% of the fluorosurfactant. Thus, in a 25% surfactant solution, the impurity is less than 1000 ppm.

As used herein, "about" refers to a possible deviation of up to ±25% from a specified value. For example, "about 2.5%" may include any value from 2.5% up to 3.125% (i.e., 2.5%×1.25), or any value from 2.5% to 1.875% (i.e., 2.5%×0.75). Additional, "about equimolar" may include any value from 1:1 molar ratio to 0.75:1 up to 1.25:1 molar ratio.

The fluorosurfactant formulation further comprises an iodide additive that provides iodide at an amount of about 0.5-2.5% of the short-chain fluorosurfactant. Suitable iodide additives are water soluble iodide salts that preferably can at least partially dissociate into free iodide ions in water. Examples include lithium iodide (LiI), sodium iodide (NaI), potassium iodide (KI), ammonium iodide (NH$_4$I) and the like. Although iodide salts that are freely dissociable in water are preferred (e.g., LiI), complete dissolution in water is not strictly required because silver iodide formation is thermodynamically favorable to most other iodide salts.

In preferred embodiments, the amount of the iodide in the fluorosurfactant formulation is about 0.6-2.4% by weight of the fluorosurfactant. Thus, in a fluorosurfactant formulation that has 25% by weight of the fluorosurfactant, the iodide is in a concentration of 1500-6000 ppm.

In various embodiments, the amount of the iodide could be 0.5%, 0.6%, 0.7%, 0.8%, 0.9%, 1%, 1.1%, 1.2%, 1.3%, 1.4%, 1.5%, 1.6%, 1.7%, 1.8%, 1.9%, 2%, 2.1%, 2.2%, 2.3%, 2.4% or 2.5% by weight of the fluorosurfactant.

The amount of the iodide in the fluorosurfactant formulation is calibrated to correspond to an amount of silver ions in the nanowire formulation. Generally speaking, the amount of the iodide should be about equimolar to the silver ions. The iodide is thus intended to bind to silver ions to form silver iodide, thereby reducing silver degradation due to ionic migration.

As demonstrated in the Examples here, the presence of iodide in the coating solution clearly gives rise to long-term film reliability (e.g., no or little sheet resistance drift after a prolong period of light exposure). There is an additional yet unexpected benefit when the iodide is combined with the nanowires shortly before coating (e.g., within 2 hours). It is discovered that the presence of the un-sequestered silver ions during the coating process provide films with fewer defects (e.g., bubbles). It is therefore speculated that the silver ions likely facilitate wire dispersion (e.g., due to ionic repulsion), thereby improving coating quality.

A further embodiment thus discloses a two-part kit for coating silver nanowires, comprising:
(1) a first container including a nanowire formulation including:
  a. a plurality of silver nanowires;
  b. a viscosity modifier;
  c. an optional dispersant; and
  d. a liquid carrier including water;
(2) a second container including a purified surfactant formulation described above
  wherein,
  the nanowire-containing formulation comprises silver ions at an amount of 0.005-0.02% per 1% of the silver nanowires by weight; and
  the purified surfactant formulation comprises iodide ions at an amount of about equimolar of the silver ions of nanowire-containing formulation.

The silver nanowires preferably are no more than 30 nm in diameter, and are more than 5 μm long. In various embodiments, the silver nanowires have mean diameter of between about 21 and 23 nm and a standard deviation in the range of 3 to 4 nm. In other embodiments, the silver nanowires have a mean length of about 12-20 μm and a standard deviation of about 6 to 8 μm. The silver nanowires may be prepared by a method described in co-pending, co-owned U.S. Patent Application Publication No. 2015/0290715, which application is incorporated herein by reference in its entirety.

In various embodiments, the viscosity modifier may be a hydrophilic polymer, including for example, hydroxypropyl methyl cellulose (HPMC), methyl cellulose, xanthan gum, polyvinyl alcohol, carboxy methyl cellulose, and hydroxy ethyl cellulose.

In various embodiments, the ratio of the silver nanowires and the viscosity modifier is in the range of 0.00626 to 5. In preferred embodiments, the ratio is in the range of 0.1-1. In a preferred embodiment, the ratio is in the range of 0.4-0.5.

In various embodiments, the nanowire formulation optionally includes a dispersant. The dispersant may be the same or different from the purified fluorosurfactant in the second container. Preferably, the dispersant should not contain any iodide, to ensure that the iodide source of the final coating composition is solely from the fluorosurfactant formulation in a controlled amount. Examples of the dispersant in the nanowire formulation may be a surfactant sold under the trade name FS-3100 (DuPont).

The liquid carrier contains water. In various embodiments, the liquid carrier may further contain one or more water-miscible cosolvents, including isopropanol, acetone, diacetone alcohol, and the like.

The nanowire formulation may be concentrated (i.e., "ink concentrate") and it can be diluted before being combined with the fluorosurfactant formulation, which process will dilute the ink concentrate even further.

In various embodiments, after dilution of the ink concentrate and combination with the fluorosurfactant, the final coating composition includes, by weight, from 0.05% to 1.4% metal nanowires, from 0.0025% to 0.1% fluorosurfactant, from 0.02% to 4% viscosity modifier, from 94.5% to 99.0% liquid carrier.

The final coating composition may be coated on a substrate by slot-die, spin-coating or roll-to-roll coating methods. "Substrate" refers to a non-conductive material onto which the metal nanostructure is coated or laminated. The substrate can be rigid or flexible. The substrate can be clear or opaque. Suitable rigid substrates include, for example, glass, polycarbonates, acrylics, and the like. Suitable flexible substrates include, but are not limited to: polyesters (e.g., polyethylene terephthalate (PET), polyester naphthalate, and polycarbonate), polyolefins (e.g., linear, branched, and cyclic polyolefins), polyvinyls (e.g., polyvinyl chloride, polyvinylidene chloride, polyvinyl acetals, polystyrene, polyacrylates, and the like), cellulose ester bases (e.g., cellulose triacetate, cellulose acetate), polysulfones such as polyethersulfone, polyimides, silicones and other conventional polymeric films. Additional examples of suitable substrates can be found in, e.g., U.S. Pat. No. 6,975,067.

Following coating, the volatile components, including water and any co-solvents, are removed by evaporation or baking. The non-volatile components, including silver nanowires, viscosity modifier and short-chain fluorosurfactant form a nanowire layer in which the silver nanowires form a conductive network. The nanowire layer may be further processed into an optical stack, including being overcoated by an overcoat layer, or bonded to another layer by an optically clear adhesive (OCA).

In certain embodiments, the overcoat includes additives that stabilize the underlying silver nanowires. In certain embodiments, the additives are transition metal complexes (e.g., $Fe(acac)_3$) as described in U.S. Patent Application Publication No. 2015/0270024, which is incorporated by reference in its entirety.

Typically, the optical transparence or clarity of the transparent conductor (i.e., a conductive network on a non-conductive substrate) can be quantitatively defined by parameters including light transmission and haze. "Light transmission" refers to the percentage of an incident light transmitted through a medium. In various embodiments, the light transmission of the conductive layer is at least 80% and can be as high as 98%. Performance-enhancing layers, such as an adhesive layer, anti-reflective layer, or anti-glare layer, may further contribute to reducing the overall light transmission of the transparent conductor. In various embodiments, the light transmission (T %) of the transparent conductors can be at least 50%, at least 60%, at least 70%, or at least 80% and may be as high as at least 91% to 92%, or at least 95%.

Haze (H %) is a measure of light scattering. It refers to the percentage of the quantity of light separated from the incident light and scattered during transmission. Unlike light transmission, which is largely a property of the medium, haze is often a production concern and is typically caused by surface roughness and embedded particles or compositional heterogeneities in the medium. Typically, haze of a conductive film can be significantly impacted by the diameters of the nanostructures. Nanostructures of larger diameters (e.g., thicker nanowires) are typically associated with a higher haze. In various embodiments, the haze of the transparent conductor is no more than 10%, no more than 8%, or no more than 5% and may be as low as no more than 2%, no more than 1%, or no more than 0.5%, or no more than 0.25%.

The transparent conductor structures, their electrical and optical properties, and the methods of patterning are illustrated in more detail by the following non-limiting examples.

EXAMPLES

Example 1

Purification of Short-Chain Fluorosurfactant

Impurities present in certain fluorosurfactant can have a negative impact on coating performance. One known impurity in commercial short-chain fluorosurfactant (Hexafor612N) is unreacted 3-mercaptopropionic acid which can passivate silver nanowires, thereby rendering the network non-conductive due to poor wire to wire contact. Purifying the incoming raw material can ensure that all components that negatively interact the nanowire network formation are removed prior to formulating the final coating composition. It also ensures that all coating constituents are reliable with lot-to-lot consistency.

Hexafor612N was purified by converting its acetate salt to an acid form. A strong acidic solution was first prepared by adding 110 g of 70% nitric acid (EMD, Darmstadt Germany) into 12 kg of water in a vessel. Thereafter, 2 kg of Hexafor612N (Maflon, Bergamo Italy) was added to the vessel containing DI water and acid at a rate of 50-60 ml/minute and stirred at 140 rpm. The acid form of Hexafor612N was insoluble in DI water and precipitated into solid. Water and impurities were then decanted from the precipitate and the solid was additionally washed by adding 3 kg of DI water and mixed at 140 rpm for 15 minutes followed by decantation of the fluid to further solubilize impurities as well as nitrate introduced in the acidification step. Next the solid precipitate was dissolved into 0.175 kg IPA (Ultrapure Solutions, Castroville Calif.) which produced a two-phase solution of an organic layer consisting of IPA and dissolved Hexafor612N acid and small percentage of water and separate aqueous layer consisting of DI water and small percentage of IPA. The DI water layer was removed and then an additional 0.864 kg of IPA is added followed by adding 0.403 kg of 5% of 99.995% LiOH (Alfa Aesar, Ward Hill, Mass.) in DI water to convert the Hexafor612N acid back to its salt form. This process produces a solution of purified 25% Hexafor612N lithium salt, the remainder of the solution being a 50% IPA/25% $H_2O$ solution.

Example 2

Purified Fluorosurfactant Formulation with Iodide Additive 0.1341 kg of 99.995% lithium Iodide (Aldrich, St Louis Mo.) was added to the purified 25% Hexafor612N in 50% IPA/25% $H_2O$ solution of Example 1 and stirred for 30 minutes at 140 rpm. The resulting fluorosurfactant formulation contains 4500 ppm of LiI.

Example 3

Ink 1 Formulation with Purified 25% Hexafor612N and 4500 Ppm LiI 0.735 kg of an ink concentrate containing 0.136% Ag, 0.28% Methocell 311 Binder (Dow Chemical, Midland Mich.), and 175 ppm FS-3100 (Dupont Wilmington, Del.) was first diluted by adding 1.264 kg of DI water. The diluted solution was mixed for 5 minutes at 500 rpm.

0.0028 kg of a fluorosurfactant formulation containing purified 25% Hexafor612N (Maflon, Bergamo Italy) and 4500 ppm Lithium Iodide (Sigma Aldrich, St Louis Mo.) was added to the above diluted solution and mixed for 10 minutes at 500 rpm to form a final coating composition ("Ink 1").

Example 4

INK 2 Formulation with Unpurified 25% Hexafor612N and 4500 Ppm LiI 0.735 kg of an ink concentrate containing 0.136% Ag, 0.28% Methocell 311 Binder (Dow Chemical, Midland Mich.), and 175 ppm FS-3100 (Dupont Wilmington, Del.) was first diluted by adding 1.264 kg of DI water. The diluted solution was mixed for 5 minutes at 500 rpm.

0.0028 kg of a fluorosurfactant solution containing unpurified 25% Hexafor612N (Maflon, Bergamo Italy) and 4500 ppm Lithium Iodide (Sigma Aldrich, St Louis Mo.) was added to the above diluted solution and mixed for 10 minutes at 500 rpm to form a final coating composition ("Ink 2").

Example 5

Comparative Results of Conductive Films Formed from Ink 1 and Ink 2

Ink 1 and Ink 2 were separately coated on a slot die roll-to-roll coating system on a PET film (e.g., MELINEX-454 or TORAY U483). Each ink was degassed prior to coating at −28"Hg for 30 minutes. Each ink was then coated at a flow rate of 15 ml/min. and dried at 40° C., 60° C. and 90° C. for 1 minute each. After drying, the sample was laminated at 2 MPa pressure.

Film samples from each coating were measured for sheet resistance with a non-contact conductance meter and % Haze was measured using an integrating sphere. The results are in the table below:

|  | Ink 1<br>(purified Hexafor612N) | Ink 2<br>(unpurified Hexafor612N) |
|---|---|---|
| Sheet Resistance | 130 ohm/square | Non-conductive |
| % Haze | 1.58 | 1.58 |

As demonstrated, films formed from Ink 2, which contained unpurified Hexafor612N, produced a non-conductive film due to the passivating impurities. In contrast, Ink 1, which differed from ink 2 only in that Hexafor612N was purified before formulation, produced a conductive network with satisfactory sheet resistance and haze properties.

Example 6

Reducing Coating Defects

This example demonstrates that defect levels were significantly reduced with short-chain fluorosurfactant as compared to ZONYL® FSA.

Bubble defects and particle defects in transparent conductor thin films can be very problematic. During the touch panel production, defects in patterned lines can cause shorting or reliability issues, which reduces yield and negatively impacts the manufacturing worthiness. The short-chain fluorosurfactants (including Hexafor612N) described herein have a much lower propensity for bubble defects in nanowire inks than ZONYL® FSA in the art. In addition, purified Hexafor612N also reduced particle defect levels.

Ink 1 and Ink 2 were prepared according to Examples 3 and 4, respectively.

In addition, Ink 3 with Zonyl FSA was prepared by first diluting an ink concentrate containing 0.136% Ag, 0.28% Methocell 311 Binder (Dow Chemical, Midland Mich.), and 175 ppm FS-3100 (Dupont Wilmington, Del.) by adding 1.264 kg of DI water to 0.735 kg of the ink concentrate in a 4 L Nalgene bottle and mixing. Thereafter, 0.0021 kg of a solution containing 25% Zonyl® FSA (Dupont Wilmington, Del.) was added to the diluted solution (ink concentrate and water) and mixed for 10 minutes.

Each ink was coated separately on a slot die roll to roll coating system. The solution was degassed prior to coating a −28"Hg for 30 minutes. The solution was coated at 15 ml/min. and dried at 40° C., 60° C. and 90° C. for 1 minute each. After drying, the sample was laminated at 2 MPa pressure.

Film samples were inspected across a 300 mm coating over a 2 meter length for defects with a video lamp against a black background and defect levels were listed below:

|  | Particle Defects | Bubble Defects/m$^2$ |
|---|---|---|
| Ink 1 | 2 | 0 |
| Ink 2 | 25 | 0 |
| Ink 3 | 30 | 40 |

These results demonstrate that bubble defects were greatly reduced with the implementation of the short-chain fluorosurfactant (e.g., Ink 1 and Ink 2) In addition, purification of raw materials reduced particle defects by an order of magnitude while keeping bubble counts low (see Ink 1).

It is noted that Zonyl® FSA naturally contains iodide. However, the short-chained fluorosurfactants performed much better in film formation than Zonyl® FSA.

Example 7

Stabilizing Effect of Iodide Additive

This example demonstrates that when an anion such as iodide is added to the final coating composition, the resulting conductive film shows improved reliability because the iodide ions can bind to silver cations. The reliability testing conditions are, 85° C., dry, ambient room light and fluorescent light.

It has been discovered that excess free silver cations can be detrimental to the reliability of bulk silver nanowires in the presence of light and heat. The addition of an anion such as iodide can bind silver cations and greatly improve film reliability.

The calculations of the relative amounts of silver cations, silver and iodide are as follows:

[$Ag^+$] content: 0.014% $Ag^+$ ion per 1% Ag

[Ag] of the coating composition is 0.05% Ag, it follows that [Ag+] content was 0.014%*0.05% Ag/1% Ag=0.0007%

$Ag^+$ mole=[Ag+]/Ag M.W.=0.0007%/108=6.5*E-8

LiI was added at 4500 ppm in Hexafor612; Hexafor612 was added at 353 ppm into ink; Hexafor612 was 25% concentration

[$I^-$]=0.000353/25%*0.004500=6.354*E-6

$I^-$ mole=[I−]/I M.W.=6.354*E-6/127=5*E-8

Three ink compositions with different $Ag^+/I^-$ molar ratios were prepared, among which, two (Ink 1 and Ink 5) had close to equimolar of Ag+ and $I^-$, wherein Ink 4 had no iodide.

More specifically, by the above calculation, Ink 1 of Example 3 contained silver cation ($Ag^+$) 6.5*E-8 mol and Iodide 5*E-8 mol, giving rise to the following molar ratio:

$$Ag^+/I^- \text{ molar ratio}=6.5*E-8/5*E-8=1.3/1$$

Ink 4, which had no iodide, was prepared by first diluting 0.735 kg of an ink concentrate containing 0.136% silver nanowires, 6.5*E-8 mol silver cation, 0.28% Methocell 311 Binder (Dow Chemical, Midland Mich.), and 175 ppm FS-3100 (Dupont Wilmington, Del.) by adding 1.264 kg of DI water followed by mixing the diluted solution for 5 minutes at 500 rpm. Thereafter, 0.0021 kg of a fluorosurfactant solution containing purified 25% Hexafor612N (Maflon, Bergamo Italy) with no added lithium iodide was added to the diluted solution and mixed for 10 minutes at 500 rpm.

Ink 5, which has more iodide than Ink 1, were prepared by first diluting 0.735 kg of an ink concentrate containing 0.136% Ag, 0.28% Methocell 311 Binder (Dow Chemical, Midland Mich.), and 175 ppm FS-3100 (Dupont Wilmington, Del.) by adding 1.264 kg of DI water followed by mixing the diluted solution for 5 minutes at 500 rpm. Thereafter, 0.0021 kg of a fluorosurfactant solution containing purified 25% Hexafor612N (Maflon, Bergamo Italy) with 6000 ppm of lithium iodide (6.6E-8 mole of iodide) was added to the diluted solution and mixed for 10 minutes.

Ink 1, Ink 4 and Ink 5 were separately coated on a slot die roll-to-roll coating system. Each ink was degassed prior to coating at −28"Hg for 30 minutes. Each ink was then coated at a flow rate of 15 ml/min. and dried at 40° C., 60° C. and 90° C. for 1 minute each. After drying, the sample was laminated at 2 MPa pressure.

Sample films from each coating were measured for sheet resistance (R) with a non-contact conductance meter and % Haze was measured using an integrating sphere. The results are in the table below:

| | Ag⁺/I⁻ (molar ratio) | R (ohms/sq) | Haze (%) |
|---|---|---|---|
| Ink 1 (4500 ppm LiI) | 1.3/1 | 141 | 1.16 |
| Ink 4 (no iodide) | No iodide | 146 | 1.15 |
| Ink 5 (6000 ppm LiI) | 0.98:1 | 140 | 1.19 |

These sample films were placed in reliability testing chamber and exposed to various conditions: control (ambient temperature in the range of 20-25° C., ambient fluorescent light); 85° C./dry; 85° C./85% RH; and 60° C./90% RH. FIG. 1 shows the sheet resistance changes over time in these sample films under the testing conditions. As shown, the film formed of ink 5 (equimolar Ag⁺/I⁻) demonstrates the best reliability, showing negligible drift of sheet resistance (less than 5%) over a period of >400 hours under all conditions. Similarly, the film formed of Ink 1 (close to equimolar Ag⁺/I⁻) demonstrates comparable, though less, reliability. Strikingly, the film formed of Ink 4 (having no iodide) demonstrates much faster loss of conductivity (i.e., rapid increase of sheet resistance) in all testing conditions.

Film samples prepared from Ink 1, Ink 4 and Ink 5 were also tested under accelerated light condition. Under the accelerated light condition, the light intensity is typically significantly elevated compared to the operating light intensity of the given device; the duration of the light exposure for testing the reliability of the conductive films can therefore be significantly compressed compared to the normal service life of the same device. Typically, light intensity is measured in Lumens, which is a unit of luminous flux. Under an accelerated light condition, the light is about 30 to 100 times more intense than the light condition of a device.

Figure 2:
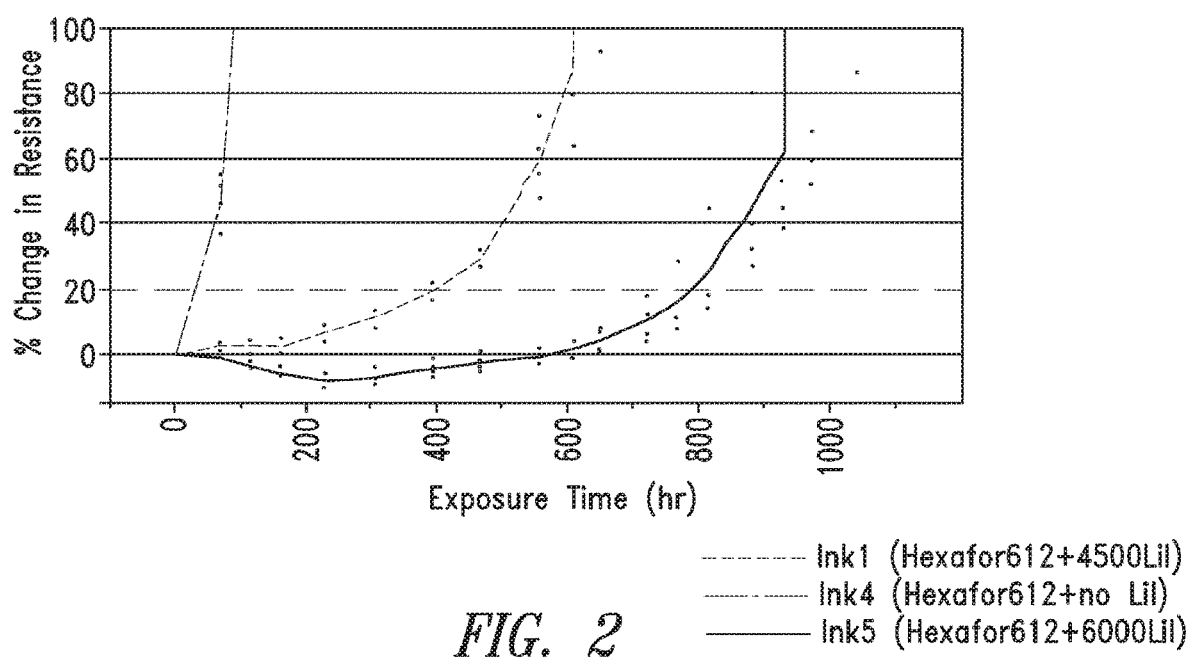
FIG. 2 shows the sheet resistance changes of conductive films over time under accelerated light condition.

FIG. 2 shows that under an accelerated light condition, sample film prepared from Ink 5 (equal molar of Ag⁺/I⁻) performed significantly better than the other samples, especially after the 500 hours mark.

All of the above U.S. patents, U.S. patent application publications, U.S. patent applications, foreign patents, foreign patent applications and non-patent publications referred to in this specification and/or listed in the Application Data Sheet are incorporated herein by reference, in their entirety.

The invention claimed is:

1. A method comprising:
providing a coating composition on a substrate, the coating composition comprising:
from 0.05% to 1.4% by weight of conductive nanostructures;
from 0.02% to 4% by weight of a viscosity modifier;
from 94.5% to 99.0% by weight of a liquid carrier; and
from 0.0025% to 0.1% by weight of a purified surfactant formulation comprising:
(1) a short-chain fluorosurfactant represented by Formula (I):

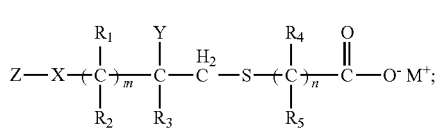

Formula (I)

(2) an impurity represented by Formula (II) at an amount of less than about 3% by weight of the short-chain fluorosurfactant,

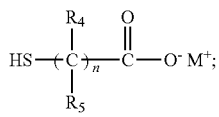

Formula (II)

and
(3) an iodide additive providing iodide at an amount of about 0.5-2.5% by weight of the short-chain fluorosurfactant, wherein:
m is 0, 1, 2, 3, 4, 5, or 6;
n is 1, 2, 3, or 4;
X is —O—, —S—, or a direct bond;
Y is hydrogen, —OH, or fluoro;
Z is —CH₃, —CH₂F, —CHF₂, or —CF₃;
M⁺ is Li⁺, Na⁺, K⁺, H⁺, or NH₄⁺; and
R₁, R₂, R₃, R₄ and R₅, at each occurrence, are the same or different and independently fluoro or hydrogen; and
drying the coating composition to form a conductive network layer.

2. The method of claim 1, wherein the impurity represented by Formula (II) is less than about 0.4% by weight of the short-chain fluorosurfactant.

3. The method of claim 1, wherein the iodide in the purified surfactant formulation is about 0.6-2.4% by weight of the short-chain fluorosurfactant.

4. The method of claim 1, wherein the conductive nanostructures comprise silver nanowires.

5. The method of claim 1, wherein the short-chain fluorosurfactant represented by Formula (I) has no more than 6 fluoro-bearing carbons.

6. The method of claim 1, wherein X is the direct bond.

7. The method of claim 1, wherein Y is —OH.

8. The method of claim 1, wherein Z is —CF₃.

9. The method of claim 1, wherein m is 6 and n is 2.

10. The method of claim 4, wherein the silver nanowires are no more than 30 nm in diameter and are more than 5 μm long.

11. The method of claim 1, further comprising forming an overcoat layer on the conductive network layer.

12. The method of claim 1, further comprising bonding the conductive network layer to a layer with an optically clear adhesive.

13. The method of claim 1, further comprising laminating the conductive network layer at a pressure.

14. The method of claim 1, wherein providing the coating composition on the substrate comprises a roll-to-roll coating.

15. A layer comprising:
a conductive network of nanowires;
a viscosity modifier; and
a short-chain fluorosurfactant represented by Formula (I):

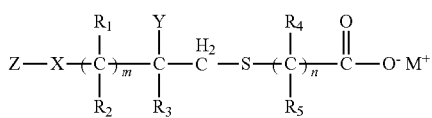

Formula (I)

wherein:
m is 0, 1, 2, 3, 4, 5, or 6;
n is 1, 2, 3, or 4;
X is —O—, —S—, or a direct bond;
Y is hydrogen, —OH, or fluoro;

Z —CH$_3$, —CH$_2$F, —CHF$_2$, or —CF$_3$;

M$^+$ is Li$^+$, Na$^+$, K$^+$, H$^+$, or NH$_4^+$; and

R$_1$, R$_2$, R$_3$, R$_4$, and R$_5$, at each occurrence, are the same or different and independently fluoro or hydrogen.

16. The layer of claim 15, further comprising an overcoat or an optically clear adhesive.

17. The layer of claim 15, wherein a light transmission of the layer is at least 80%.

18. The layer of claim 15, wherein a haze of the layer is no more than 2%.

19. The layer of claim 15, wherein the nanowires comprise silver nanowires.

20. An optical stack comprising the layer of claim 15.

* * * * *